Figure 1:
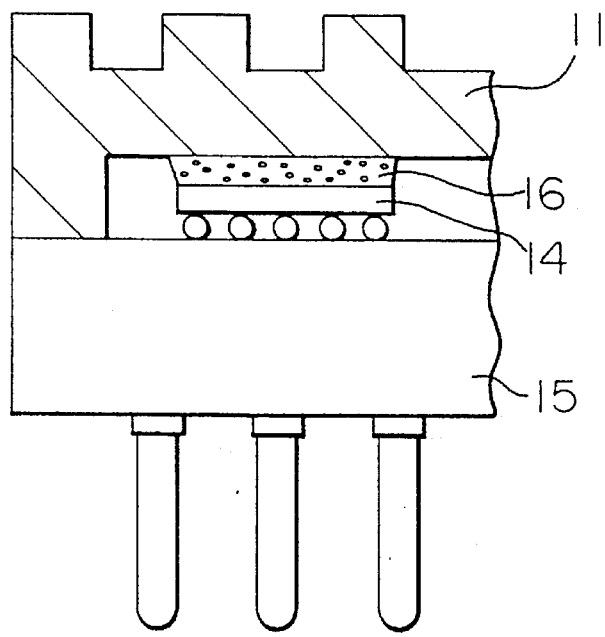

United States Patent

Uematsu et al.

[11] Patent Number: 5,549,835
[45] Date of Patent: Aug. 27, 1996

[54] APPARATUS EQUIPPED WITH A COOLING BLOCK UNIT HAVING SLIDING PARTS AND A COMPOUND USED TO THE SAME

[75] Inventors: Takao Uematsu, Hitachi; Mitsuyoshi Shoji, Ibaraki-ken; Takayuki Nakakawaji, Hitachi; Shigeki Komatsuzaki, Mito; Yutaka Ito, Takahagi; Atsushi Morihara, Katsuta; Koji Sato, Hitachi; Shizuo Zushi, Hadano; Hiroshi Go, Zama, all of Japan

[73] Assignee: Hitachi, Ltd., Tokyo, Japan

[21] Appl. No.: 545,908

[22] Filed: Oct. 19, 1995

Related U.S. Application Data

[63] Continuation of Ser. No. 131,966, Oct. 8, 1993, abandoned, which is a continuation of Ser. No. 799,115, Nov. 27, 1991, abandoned.

[30]     Foreign Application Priority Data

Nov. 28, 1990   [JP]   Japan ..................... 2-323157

[51] Int. Cl.$^6$ ..................... C10M 141/12; C10M 157/10
[52] U.S. Cl. .................. 508/204; 508/205; 508/207; 508/501; 508/555; 508/584
[58] Field of Search ................. 252/54, 54.6, 51.5 R, 252/51.5 A, 58, 52 A, 49.6, 18, 25

[56]              References Cited

U.S. PATENT DOCUMENTS

| | | | |
|---|---|---|---|
| 3,784,471 | 1/1974 | Kaiser | 252/18 |
| 3,882,033 | 5/1975 | Wright | 252/25 |
| 4,174,461 | 11/1979 | Sianesi et al. | 252/54 |
| 4,265,775 | 5/1981 | Aakalu | 252/28 |
| 4,292,223 | 9/1981 | Theodore et al. | 260/29.15 B |
| 4,518,513 | 5/1985 | Lachner et al. | 252/25 |
| 4,544,696 | 10/1985 | Streusand et al. | 524/428 |
| 4,588,768 | 5/1986 | Streusand et al. | 524/443 |
| 4,604,242 | 8/1986 | Cole et al. | 524/852 |
| 4,897,211 | 1/1990 | Dekura et al. | 252/18 |
| 4,941,987 | 7/1990 | Strepparola | 252/58 |
| 5,004,554 | 4/1991 | Tohzuka et al. | 252/52 A |
| 5,071,715 | 12/1991 | Shoji et al. | 252/52 A |

FOREIGN PATENT DOCUMENTS

| | | |
|---|---|---|
| 63-057693 | 3/1988 | Japan . |
| 63-251455 | 10/1988 | Japan . |
| 2138396 | 5/1990 | Japan . |

*Primary Examiner*—Margaret Medley
*Attorney, Agent, or Firm*—Antonelli, Terry, Stout & Kraus

[57]              ABSTRACT

Disclosed are an apparatus having sliding parts and a compound for preventing diffusion or separation of a base oil; and a compound for preventing diffusion or separation of the base oil used for the apparatus: an electronic or electric appliance using a joul heat generating source, means for taking out joul heat to the outside by sliding with said heat generating source, and heat conducting compound intervenient between said heat taking out means and heat generating source; and the heat conducting compound used for the appliance.

12 Claims, 2 Drawing Sheets

APPARATUS EQUIPPED WITH A COOLING BLOCK UNIT HAVING SLIDING PARTS AND A COMPOUND USED TO THE SAME

This application is a continuation of application Ser. No. 08/131,966, filed Oct. 8, 1993, which is a continuation of application Ser. No. 07/799,115, filed Nov. 27, 1991, now abandoned.

This invention relates to an apparatus having sliding parts and a composition for preventing diffusion or separation of a base oil; and to the composition for preventing diffusion or separation of the base oil used for the apparatus. Also, the invention relates to an electronic or electric appliance using a joule heat generating source, means for transferring the joule heat to the outside by sliding with said a heat generating source, and heat conducting composition located between said heat transfer means and heat generating source; and the heat conducting composition used for the appliance.

Grease used for the electronic or electric appliance and precision instruments such as various kinds of sliding parts, various kinds of bearings, switches, electric contacts and the like in recent years are required to have more excellent characteristics in the point of thermal stability at a high temperature and low friction torque at a low temperature, in many cases. As a base oil of grease, generally used are low viscosity synthetic oils having good heat resistance in order to obtain such characteristics. However, use of low viscosity synthetic oils causes problems of grease leakage or the separation of the base oil from the grease. There is a method of hardening the grease by adding a somewhat larger amount of a thickener having excellent shear stability for the problem of grease leakage.

Japanese Patent Application Kokai (Laid-Open) No. 57693/88 discloses non-diffusing greases containing fluorine based surfactants having fully fluorinated i.e. fluoro carbon chain (perfluoro carbon chain) as means for reducing base oil separation (bleeding) or oil diffusion. Since any surfactants disclosed therein is solubilized in the base oil, non-diffusing property of the oil is not so good in practice.

On the one hand, greases or compounds blended with heat conducting fillers to quickly radiate or transmit heat generated in electric parts with ensuring electrical insulating property in electric appliance are disclosed in Japanese Patent Application Kokoku (Examined) No. 36302/82 and Japanese Patent Application Kokai (Laid-Open) No. 251455/88. However, in Japanese Patent Application Kokoku (Examined) No. 36302/82 no materials preventing oil diffusion or bleeding are added, and also in Japanese Patent Application Kokai (Laid-Open) No. 251455/88 the base oil separation or bleeding occurs owing to use of surfactants having compatibility with the base oil, which leads to a cause of staining apparatus or defect in electric contact.

There are also disclosed "lubricating grease" in U.S. Pat. No. 4,251,431, "grease composition" in U.S. Pat. No. 4,132,660 and "perfluorated aliphatic polyalkyl ether lubricant containing additives of aromatic phosphine substituted with perfluoro alkyl ether group" in U.S. Pat. No. 4,438,007, and the like. Any of them use the surfactant compatible with the base oil.

Greases or thermal compounds tend to bleed and diffuse the base oil from the coated part with passage of time after coating. The lower viscosity of the base oil and the greater penetration (softer) of the grease and further the higher temperature in use, the more remarkable such tendency. Separated or bleeded base oil leads to or causes staining of the apparatus or poor performance of electric contact, or promote lowering or deterioration of mechanical property of resins. Therefore, development of grease with little base oil separation or bleeding is strongly demanded in several fields recently. Especially, heat conducting compositions used in the electronic or electric appliance such as cooling structure and the like of computers are required to cause no base oil separation or bleeding because it is charged near the semiconductor chip generating heat.

However, any conventional compositions are not satisfactory in view of prevention of separation, bleeding or diffusion of the base oil.

It is an object of this invention to prevent separation, bleeding or diffusion of the base oil during use of semi-solid composition containing the base oil and thickener.

Primarily, the surfactant decrease surface tension or interfacial tension of a liquid component such as a base oil or heat conducting filler, and further promote separation, bleeding or diffusion of the base oil. The present invention is based on the finding that separation, bleeding or diffusion of the base oil can be prevented by blending a fluorine based compound slightly soluble in the base oil in a composition containing the base oil and thickener.

Figure 2:
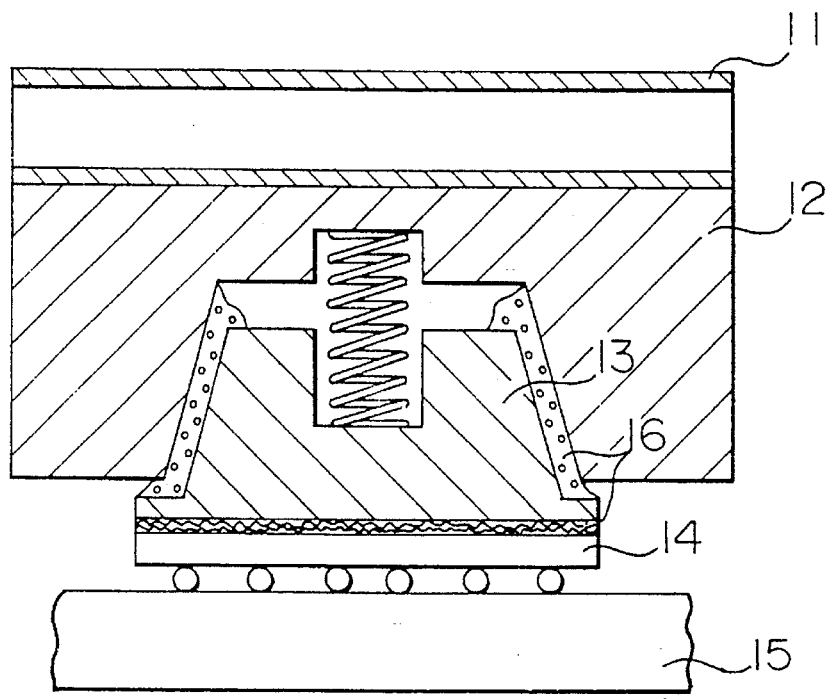
Figure 3:
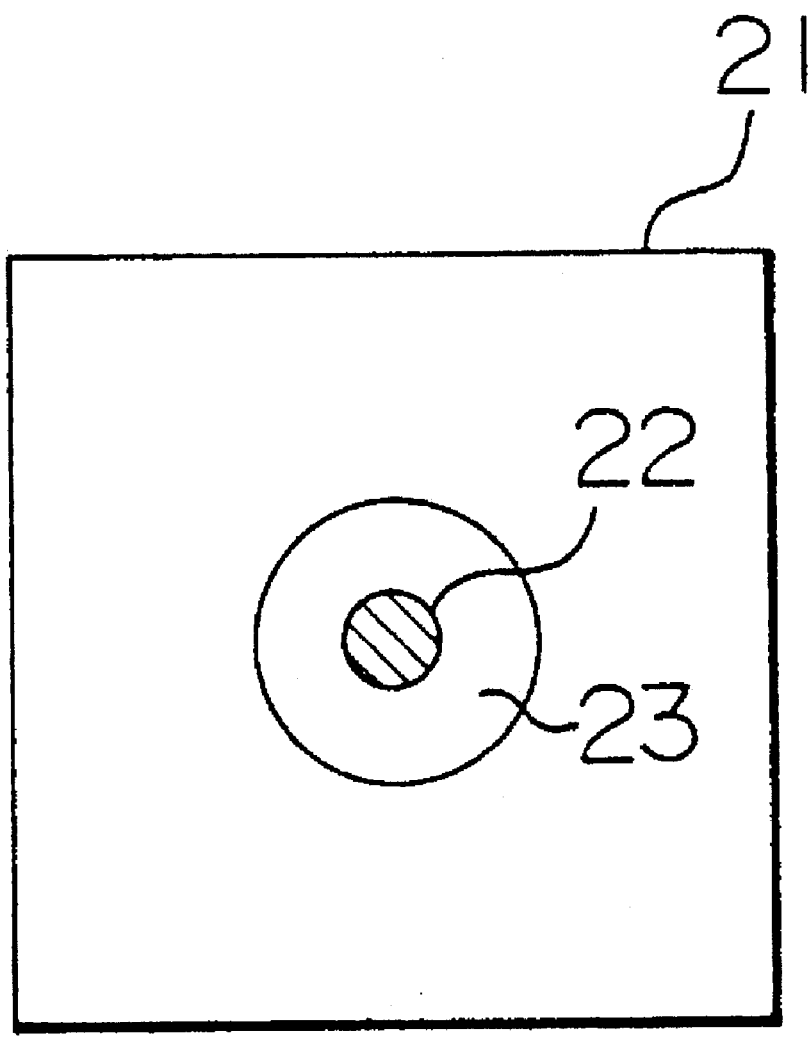

FIG. 1 and 2 are perspective view of the structure simulating the cooling structure used to evaluate bleeding or diffusion of the base oil of the heat conducting compound. FIG. 3 is a illustration view explaining the base oil diffusion evaluation test method.

1 . . . aluminium nitride plate, 2 . . . compound, 3 . . . diffusion part of the oil, 11 . . . heat dissipator, 12, 13 . . . heat conducting block, 14 . . . semiconductor chip, 15 . . . substrate, 16 . . . heat conducting compound.

The fluorine based organic compound used in the present invention is especially effective when used in combination with non-fluorine based synthetic oil. Furthermore, the fluorine based organic compound is preferably a fluorine based surfactant slightly soluble in the synthetic oil (which result in colloid or float up state when mixed with the synthetic oil) is preferred. The fluorine containing group is preferably obtained by combining a perfluoropolyoxyalkyl group or perfluoropolyoxyalkylene group with an organic group. Especially, it is preferable that a compound the fluorine based organic be slightly soluble in said base oil and represented by following general formula:

$$(R_f)_n\text{---}X$$

wherein $R_f$ is perfluoropolyoxyalkyl group or perfluoropolyoxyalkylene group, X is a fluorine free organic group and n is an integer of 1 or 2.

In these compounds, one or more of those represented by below the formulae (i)–(iii) shown below is used especially effectively.

$$R_f\text{---}R_1\text{---}R_2\text{---}Si(OR_3)_3 \qquad (i)$$

wherein $R_f$ is perfluoropolyoxyalkyl group or perfluoro polyoxyalkylene group, $R_1$ is either amide bond, ester bond or methyl ether bond, $R_2$ is either $C_2$–$C_5$ alkylene group or amino-substituted alkylene group, and $R_3$ is $C_1$–$C_3$ alkyl group.

The concrete examples of the fluorine based compound having silanol group in the terminal are following substances.

(1) $R_f\text{---}CONH\text{---}C_3H_6\text{---}Si(OC_2H_5)_3$
(2) $R_f\text{---}CONH\text{---}C_2H_4NHC_3H_6\text{---}Si(OC_2H_5)_3$
(3) $R_f\text{---}CONH\text{---}C_2H_4NHC_3H_6\text{---}Si(OCH_3)_3$
(4) $R_f\text{---}CH_2O\text{---}C_3H_6\text{---}Si(OCH_3)_3$ (5) $R_f$—COO—$C_3H_6$—$OC_3H_6$—Si($OCH_3$)$_3$ The compounds represented by the following general formulae (ii) and (iii) are also mentioned.

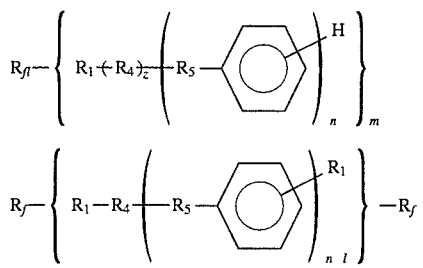

wherein $R_f$ is perfluoropolyoxyalkyl group or perfluoropolyoxyalkylene group; $R_1$ is ester bond, amide bond or methyl ether bond; $R_4$ is an oxyalkylene group having 2 or 3 carbon atoms, phenyl group or alkylene group having 1 or 2 carbon atoms; $R_5$ is single bond, ether bond, alkyl group, amide bond or —C(CH$_3$)$_2$— group, and may be different per repeating unit; Z is 0 or a positive integer; n is 0 or a positive integer when $R_4$ is oxyalkylene group, or an integer of 1–5 when $R_4$ is not oxyalkylene group; $R_f$ is perfluoropolyoxyalkyl group when l is 1 or 2 and m is 1, or perfluoropolyoxyalkylene group when l is 1 and m is 2; and l and m cannot be 2 at the same time.

The concrete examples are

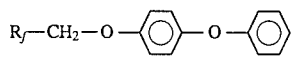 (6)

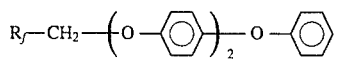 (7)

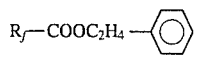 (8)

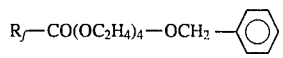 (9)

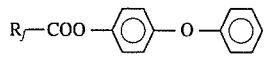 (10)

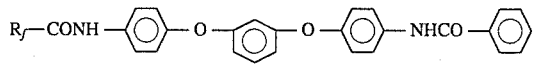 (11)

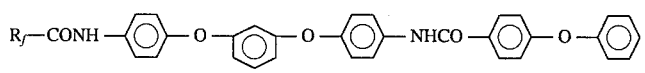 (12)

 (13)

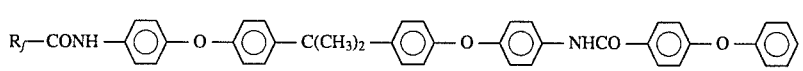 (14)

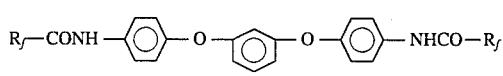 (15)

 (16)

(17)

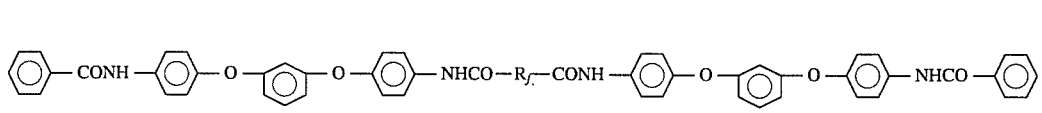

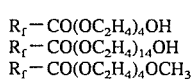
(18)
(19)
(20)

$R_f$ of the compounds (1)–(16) and (18)–(20) is F(C$_3$F$_6$C)$_n$—C$_2$F$_4$, and n is 14 on the average. $R_f$ of the compound (17) is —[(C$_3$F$_6$O)$_{33}$—(CF$_2$O)$_{16}$ (CF$_2$)]—.

The concrete example of the fluorine based compounds are Krytox 175 series manufactured by Du Pont Co. and Fomblin Z series manufactured by Montecatini Co. while Krytox 175 series having a regular structure is especially preferred. Furthermore, those having even molecular weight as possible are preferred.

Addition amount of the fluorine based compound represented by the above general formula is not especially restricted. However, it is added generally in an amount of 0.05–14% by weight, preferably 0.1–10% by weight based on the total weight of the composition. It is difficult to expect sufficient function of preventing the base oil from separation or bleeding in the composition when the amount is less than 0.05% by weight. When the amount is more than 10% by weight, it is uneconomic.

The present invention is applied to so called greases (that contain the base oil and the thickener as the essential components), but also applied to thermal compositions (i.e., compositions containing the base oil, thickener and/or high heat-conducting powder filler having function of the thickener), which are used or have been developed in the electronic appliance and the like recently. In the instant invention these compositions are described as the composition for simplicity. The compound of the present invention is semi-solid and exhibits non-Newtonian liquid, or thixotropic property owing to the action of the thickener. The thickener includes metal soap type, complex soap type, high molecular weight urea type and the like; and inorganic fine powders such as silicon dioxide, bentone and the like. When the composition is required to have a high heat conducting property, the high heat conducting inorganic powder is further added, but a high heat conducting inorganic filler of small diameter may be added in place of the thickener.

The heat conducting inorganic filler powder includes a heat conducting compound containing a heat conducting filler, such as a metal oxide, having thermal conductivity of more than 7 W/m·K, silicon carbide, boron nitride, aluminium nitride and silicon nitride; a heat conducting compound containing a heat conducting filler in a base oil such as a mineral oil or various synthetic oils. The content of the heat conducting inorganic powder is in an amount of 5–100% by weight based on the weight of the base oil. In the case of serving both as the filler and the thickener, the heat conducting powder filler preferably has a diameter as small as possible, with the average less than 1 μm, especially less than 0.5 μm being preferred. The composition may contain 5–100% by weight of the heat conducting powder.

The base oil includes the mineral oil, various synthetic oils and the like, and the synthetic oils are especially preferred in view of thermal stability, viscosity and the like.

Various additives may be added in order to improve of thermal stability, anti-rust and anti-corrosion to metal of the composition.

In the present invention, separation, bleeding or diffusion of the base oil is reduced by containing the fluorine based organic compound slightly soluble in the base oil in the composition. Since the fluorine based compound used in the instant invention is not dissolved or hardly dissolved in the base oil, the fluorine based compound exists being dispersed in the composition, or adhering to the surface of the filler, or being in the mixed state of both. And this becomes barrier and has a function of controlling separation, bleeding or diffusion of the base oil. It has been found that the smaller contact angle of the fluorine based compound insoluble in the base oil, the greater function of controlling separation, bleeding or diffusion of the base oil.

Test methods with regard to preventing effect of separation, bleeding or diffusion of the base oil from the composition according to the present invention is explained below.

(1) Oil Separation Test (JIS K 2220)

About 10 g of the composition is weighed out on a 60 mesh cone wire gauze. This is hung in a glass beaker, and left 24 hours in a constant temperature bath maintained at 150° C. Thereafter, the amount of oil dropped into the beaker was measured to calculate separation ratio to the composition, which ratio was represented as oil separation degree.

(2) Penetration Test (JIS K 2220)

Since the softer composition is, the greater the tendency of the amount of bleeding become, penetration is measured. The composition is placed in a mixing vessel and maintained at 25° C., then worked 60 times of back and forth, immediately then penetration was measured.

(3) Base oil Diffusion Test

The test method is shown in FIG. 3. The composition is rendered to adhere to the point of a syringe, and then about 0.2 g of the compound 22 was coated on an aluminium nitride plate (0.6 mm thick, 100×100 mm) 21 having a maximum surface roughness of 5 μm into a circular moutain shape (about 4 mm in diameter). This was left in a constant temperature bath at 150° C. for 20 hours, width (mm) of bleeded or diffused part of the base oil 23 was measured, and this diffusion width was calculated according to the following equation.

diffusion width (mm)=diffusion amount−diameter of coated compound/2

The present invention is illustrated by the following examples in more detail.

EXAMPLE 1

To a composition composed of 91% by weight of poly-α-olefine oil (Gargoyle Arctic SHC 226, manufactured by Mobil Co.) having a viscosity at 40° C. of 68.1 mm$^2$/s as a base oil, and 7% by weight of lithium 12-hydroxy stearate as a thickener, there were added 2% by weight of various fluorine based compounds shown in Table 1. The mixture was heated to 150° C. with stirring, then gradually cooled to the room temperature. This mixture was finished with three rolls. The penetration degree, oil separation degree and diffusion width of the base oil of the thus obtained composition were measured. The results are shown in Table 1.

COMPARATIVE EXAMPLE 1

A composition composed of 7% by weight of lithium stearate as the thickener, 88% by weight of the synthetic oil used in Example 1 as the base oil and 5% by weight of a fluorinated alkyl ester (FC-430, made by Sumitomo 3M Co.) as the fluorine based surfactant was prepared.

COMPARATIVE EXAMPLE 2

A composition composed of the following components was prepared.

thickener: 10% by weight of lithium 12-hydroxystearate base oil: 85% by weight of mineral oil having a viscosity at 40° C. of 110 mm$^2$/s fluorine based surfactant: 5% by weight of surfactant used in Comparative Example 1

COMPARATIVE EXAMPLE 3

A composition composed of the following components was prepared.

thickener: 10% by weight of lithium 12-hydroxystearate, base oil: 80% by weight of diethyl hexyl sebacate (mineral oil having a viscosity at 40° C. of 11.0 mm$^2$/s)

fluorine based surfactant: 10% by weight of perfluoroalkyl carboxylic acid.

COMPARATIVE EXAMPLE 4

A heat conducting composition composed of the following components was prepared.

heat conducting powder: 50% by weight of zinc oxide (0.5 μm in average particle diameter)

base oil: 50% by weight of dimethylpolysiloxane oil having a viscosity at 25° C. of 350.0 mm$^2$/s

COMPARATIVE EXAMPLE 5

A heat conducting composition composed of the following components was prepared.

heat conducting powder: 50% by weight of BN (boron nitride GP, 0.5 μm in average particle diameter)

base oil: 50% by weight of perfluoro polyether (Fomblin Y-45, made by Montecatini Co.) having a viscosity at 40° C. of 150.0 mm$^2$/s

TABLE 1

| Compound No. | Worked penetration | Oil separation (wt. %) (150° C., 24 h) | Diffusion width (mm) (150° C., 15 h) |
| --- | --- | --- | --- |
| 1 | 335 | 0 | 0 |
| 2 | 340 | 0 | 0 |
| 3 | 341 | 0 | 0 |
| 4 | 338 | 0 | 0.4 |
| 5 | 339 | 0 | 0 |
| 6 | 310 | 0.01 | 1.7 |
| 7 | 305 | 0.01 | 1.9 |
| 8 | 320 | 0.02 | 1.1 |
| 9 | 325 | 0.03 | 1.0 |
| 10 | 310 | 0.03 | 2.4 |
| 11 | 328 | 0 | 0 |
| 13 | 310 | 0.01 | 2.3 |
| 14 | 300 | 0.02 | 3.5 |
| 15 | 299 | 0.01 | 2.5 |
| 17 | 287 | 0.01 | 1.8 |
| Comparative Example 1 | 340 | 5.8 | 62.5 |
| Comparative Example 2 | 348 | 6.2 | 32.4 |
| Comparative Example 3 | 341 | 7.6 | 40.6 |
| Comparative Example 4 | 305 | 9.8 | 28.4 |
| Comparative Example 5 | 299 | 6.0 | 55.3 |

EXAMPLE 2

To a composition composed of 7% by weight of lithium stearate (thickener) in poly-α-olefine oil (base oil) having a viscosity at 40° C. of 68.1 mm²/s were added 2% by weight of various fluorine based compounds shown in Table 2. The mixture was heated to 150° C. with stirring, then gradually cooled to room temperature. This mixture was finished with three rolls. The penetration degree, oil separation degree, and diffusion width of the base oil of the thus obtained compound were measured. The results are shown in Table 2.

TABLE 2

| Compound No. | Worked penetration | Oil separation (wt. %) (150° C., 24 h) | Diffusion width (mm) (150° C., 15 h) |
| --- | --- | --- | --- |
| 1 | 332 | 0 | 0 |
| 2 | 336 | 0 | 0 |
| 3 | 320 | 0 | 0 |
| 4 | 340 | 0 | 0.3 |
| 5 | 338 | 0 | 0 |
| 6 | 310 | 0 | 1.6 |
| 7 | 315 | 0 | 1.7 |
| 8 | 318 | 0.01 | 0.9 |
| 9 | 322 | 0 | 0.8 |
| 10 | 330 | 0.01 | 2.5 |
| 11 | 327 | 0 | 0 |
| 13 | 325 | 0 | 2.3 |
| 14 | 317 | 0 | 3.7 |
| 15 | 310 | 0 | 2.6 |
| 17 | 308 | 0 | 2.0 |

EXAMPLE 3

To a composition composed of 10% by weight of a high molecular urea compound (thickener) obtained by reacting diisocyanate with diamine in a mineral oil (base oil) having a viscosity at 40° C. of 110.0 mm²/s was added 2% by weight of various fluorine based compounds shown in Table 3. The mixture was heated to 150° C. with stirring, then gradually cooled to room temperature. This mixture was finished with three rolls. The penetration degree, oil separation degree and diffusion width of the base oil of the thus obtained composition were measured. The results are shown in Table 3.

TABLE 3

| Compound No. | Worked penetration | Oil separation (wt. %) (150° C., 24 h) | Diffusion width (mm) (150° C., 15 h) |
| --- | --- | --- | --- |
| 1 | 280 | 0 | 0 |
| 2 | 265 | 0 | 0 |
| 3 | 275 | 0 | 0 |
| 4 | 285 | 0 | 0 |
| 5 | 281 | 0 | 0 |
| 6 | 271 | 0 | 0.9 |
| 7 | 250 | 0 | 1.2 |
| 8 | 262 | 0.02 | 1.8 |
| 9 | 268 | 0 | 1.0 |
| 10 | 255 | 0 | 0 |
| 11 | 260 | 0 | 2.0 |
| 13 | 253 | 0 | 2.5 |
| 14 | 258 | 0 | 1.9 |
| 15 | 263 | 0 | 1.0 |
| 17 | 250 | 0 | 1.4 |

EXAMPLE 4

To a heat conducting composition composed of 50% by weight of zinc oxide powder (0.5 μm in average particle diameter) in dimethyl polysiloxane (base oil) having a viscosity at 25° C. of 350.0 mm² were added 1.15% by weight of the fluorine based compounds shown in Table 4. The mixture was heated to 200° C. with stirring, then gradually cooled to room temperature, and finished with three rolls. The penetration degree, oil separation degree and diffusion width of the base oil of the heat conducting composition thus obtained. The results are shown in Table 4.

TABLE 4

| Compound No. | Worked penetration | Oil separation (wt. %) (150° C., 24 h) | Diffusion width (mm) (150° C., 15 h) |
| --- | --- | --- | --- |
| 1 | 240 | 0 | 0.2 |
| 2 | 232 | 0 | 0.1 |
| 3 | 245 | 0 | 0.2 |
| 4 | 255 | 0 | 0.5 |
| 5 | 235 | 0 | 0.1 |
| 6 | 260 | 0.05 | 2.0 |
| 7 | 270 | 0.06 | 2.3 |
| 8 | 260 | 0.03 | 2.1 |
| 9 | 283 | 0.04 | 1.8 |
| 10 | 250 | 0.07 | 2.7 |
| 11 | 346 | 0.03 | 1.2 |
| 13 | 368 | 0.03 | 2.6 |
| 14 | 289 | 0.01 | 2.1 |
| 15 | 358 | 0.01 | 1.9 |
| 17 | 330 | 0.02 | 2.0 |

EXAMPLE 5

A heat conducting composition composed of 50% by weight of zinc oxide powder (0.5 μm in average particle diameter) in perfluoro polyether oil (Krytox 143AD, manufactured by Du Pont Co.) (base oil) having a viscosity at 40° C. of 80 mm²/s was added 1.15% by weight of the fluorine based compounds shown in Table 5. The mixture was heated to 200° C. with stirring, then gradually cooled to room temperature, and finished with three rolls. The penetration degree, oil separation degree and diffusion width of the base oil of the heat conducting composition thus obtained. The results are shown in Table 5.

As is clear from Tables in Examples, the composition and heat conducting compound of the instant invention have quite small values of oil separation degree and diffusion of the base oil. In contrast with this, conventional composition have large values of oil separation degree and diffusion of the base oil.

TABLE 5

| Compound No. | Worked penetration | Oil separation (wt. %) (150° C., 24 h) | Diffusion width (mm) (150° C., 15 h) |
| --- | --- | --- | --- |
| 1 | 258 | 0.01 | 0.3 |
| 2 | 230 | 0.01 | 0.3 |
| 3 | 220 | 0.02 | 0.2 |
| 4 | 242 | 0.05 | 0.5 |
| 5 | 220 | 0.04 | 0.7 |
| 6 | 267 | 0.20 | 1.1 |
| 7 | 250 | 0.10 | 1.8 |
| 8 | 245 | 0.15 | 1.8 |
| 9 | 231 | 0.13 | 1.5 |
| 10 | 250 | 0.16 | 2.0 |
| 11 | 270 | 0.03 | 0.7 |
| 13 | 368 | 0.08 | 0.8 |
| 14 | 270 | 0.04 | 0.4 |
| 15 | 280 | 0.08 | 0.6 |
| 17 | 292 | 0.04 | 0.5 |

EXAMPLE 6

The penetration degree and oil separation degree and diffusion state of oil were measured as to heat conducting composition composed of 40% by weight of zinc oxide powder (0.5 μm in average particle diameter) in dimethyl polysiloxane (base oil) having a viscosity at 25° C. of 350.0 mm$^2$/s and 0.01–16% by weight of the fluorine based compounds of No. 1, 8, 11 and 17. The results are shown in Table 6. As is clear from Table 6, oil separation degree and diffusion of the oil are lowered when the content of the fluorine based compound is 0.05% by weight or more. The workability in coating of the compound is deteriorated when penetration degree is lowered (the composition becomes hard).

EXAMPLE 7

5 g of the fluorine based compounds of No. 1, 5, 6, 11, 14 and 17 were dissolved in trifluorotrichloroethane, then thereto was added 10 g of zinc oxide powder (0.5 μm of average particle diameter). After trifluorotrichloroethane was evaporated, surface treatment was carried by heating at 200° C. for 30 minutes, and then it was ground. 50% by weight of this zinc oxide powder was mixed with 50% by weight of dimethylpolysiloxane having the same viscosity as in Example 4, then finished with three rolls. The penetration degree and diffusion width of the base oil of the heat conducting composition thus obtained were measured. The results are shown in Table 7.

As is clear from Table 7, bleeding or diffusion of the base oil can also be prevented by pretreating the surface of the heat conducting filler.

TABLE 7

| Compound No. | Worked penetration | Diffusion width (mm) (150° C., 15 h) |
| --- | --- | --- |
| 1 | 345 | 0 |
| 5 | 335 | 0.7 |
| 6 | 320 | 2.2 |
| 11 | 325 | 1.5 |
| 14 | 313 | 4.1 |
| 17 | 300 | 1.9 |

EXAMPLE 8

FIG. 1 and FIG. 2 are cross-sectional views of one example which simulates cooling structure used to evaluate bleeding or diffusion of the base oil of the heat conducting composition in Example 7 containing the fluorine based compounds of the instant invention. The whole structure is constituted by a heat dissipator 11 made of aluminium or copper, heat conducting blocks 12 and 13 made of aluminium nitride, a semi-conductor chip 14 and a substrate board 15 made of aluminium nitride. The heat conducting composition 16 was filled between the contact surface of the heat dissipator 11 and the semi-conductor chip 14, between that of the heat dissipator 11 and the heat conducting blocks 12, 13, and between that of the heat conducting block 13 and the semi-conductor chip 14. The heat conducting composition 16 was coated in thickness of 0.1 mm between the heat dissipator 11, the heat conducting blocks 12 and 13 and the semi-conductor chip 14. This was left in the constant temperature bath at 150° C. for 24 hours, then bleeding or diffusion state of the base oil was observed. The results are shown in Table 8. As is clear from Table 8, it is found that the heat conducting composition containing the fluorine based compound of the present invention causes much less bleeding or diffusion of the base oil as compared with Comparative Examples.

TABLE 6

| Compound | | Addition amount (wt. %) | | | | | | |
| --- | --- | --- | --- | --- | --- | --- | --- | --- |
| No. | Item | 0.01 | 0.05 | 1.0 | 5.0 | 10.0 | 14.0 | 16.0 |
| 1 | Worked penetration | 246 | 255 | 238 | 240 | 220 | 213 | 200 |
|  | Oil separation (wt. %) | 6.5 | 3.3 | 0.02 | 0 | 0 | 0 | 0 |
|  | Diffusion width (mm) | 18.2 | 6.5 | 0.6 | 0 | 0 | 0 | 0 |
| 8 | Worked penetration | 275 | 280 | 268 | 255 | 247 | 233 | 215 |
|  | Oil separation (wt. %) | 7.5 | 3.8 | 0.05 | 0 | 0 | 0 | 0 |
|  | Diffusion width (mm) | 20.1 | 7.0 | 3.4 | 0.6 | 0 | 0 | 0 |
| 11 | Worked penetration | 360 | 360 | 355 | 347 | 330 | 310 | 295 |
|  | Oil separation (wt. %) | 7.8 | 3.5 | 0.07 | 0 | 0 | 0 | 0 |
|  | Diffusion width (mm) | 21.0 | 7.2 | 4.5 | 0.3 | 0 | 0 | 0 |
| 17 | Worked penetration | 340 | 346 | 335 | 330 | 318 | 310 | 285 |
|  | Oil separation (wt. %) | 7.0 | 3.0 | 0.06 | 0 | 0 | 0 | 0 |
|  | Diffusion width (mm) | 19.5 | 5.8 | 3.5 | 0.8 | 0 | 0 | 0 |

TABLE 8

| Compound No. | Worked penetration | Diffusion width (mm) (150° C., 24 h) |
|---|---|---|
| 1 | 345 | no bleeding |
| 5 | 335 | " |
| 6 | 320 | " |
| 11 | 325 | " |
| 14 | 313 | " |
| 17 | 300 | " |
| Comparative Example 1 | 340 | much bleeding |
| Comparative Example 3 | 341 | " |

Moreover, since this fluorine based compound has oleophobic property to the lubricating oil, surface treatment with the fluorine based compound has side effect which prevents bleeding or diffusion of the lubricating oil.

Since the composition of the present invention is far less in oil separation degree and diffusion width of the base oil, the compound is suitable for the precision appliance field, for example, for use such as sliding parts, bearings, switches, electric contacts and the like in the camera, watch, copying machine, printer and the like. Furthermore, it is suitable as heat conducting composition used for heat transmission of the cooling structure or electronic parts in computers.

We claim:

1. An apparatus comprising sliding parts and a heat conducting composition positioned between sliding parts, said composition containing a non-fluorine based base oil and a fluorine based organic compound slightly soluble in the base oil which prevents separation of the base oil from the composition; said fluorine based organic compound being contained in the composition in an amount of 0.05–14% by weight based on the total amount of the composition, and having one or more of perfluoropolyoxyalkyl groups or perfluoropolyoxyalkylene groups in the terminal of the molecule, and being at least one of the compounds represented by the following general formulae:

$$R_f - R_1 - R_2 - Si(OR_3)_3 \qquad (i)$$

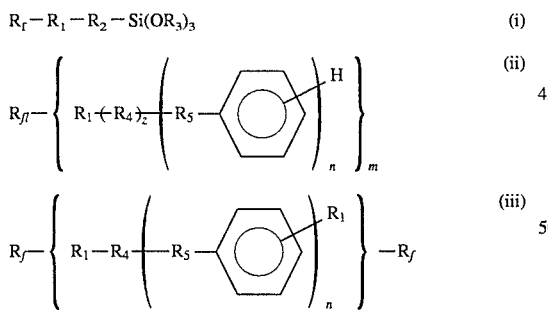

wherein $R_f$ is perfluoropolyoxyalkyl group or perfluoropolyoxyalkylene group; $R_1$ is ester bond, amide bond or methyl ether bond; $R_2$ is $C_2$–$C_5$ alkylene group or amino-substituted alkylene group; $R_3$ is alkyl group having 1–3 carbon atoms; $R_4$ is an oxyalkylene group having 2 or 3 carbon atoms, phenyl group or alkylene group having 1 or 2 carbon atoms; $R_5$ is single bond, ether bond, alkyl group, amide bond or —$C(CH_3)_2$— group, and are the same or different per repeating unit; Z is 0 or a positive integer; n is 0 or a positive integer when $R_4$ is oxyalkylene group, or an integer of 1–5 when $R_4$ is not oxyalkylene group: $R_f$ is perfluoropolyoxyalkyl group when l is 1 or 2 and m is 1, or perfluoropolyoxyalkylene group when l is 1 and m is 2; and l and m cannot be 2 at the same time.

2. The apparatus according to claim 1, wherein said composition contains 0.05–10% by weight of a fluorine based organic compound based on the total amount of said compound.

3. The apparatus according to claim 1, wherein said fluorine based organic compound is selected from the group consisting of:

$R_f$—CONH—$C_3H_6$—Si(OC$_2$H$_5$)$_3$;

$R_f$—CONH—$C_2H_4$NHC$_3$H$_6$—Si(OCH$_3$)$_2$(CH$_3$); and $R_f$—CONH—$C_2H_4$NHC$_3$H$_6$—Si(OCH$_3$)$_3$.

4. An apparatus comprising sliding parts, means for transferring heat from said sliding parts to the outside, and a heat conducting composition positioned between said heat transferring means and sliding parts, said composition containing a non-fluorine based base oil, a heat conducting inorganic powder having a thermal; conductivity or more than 7 W/m-K and a fluorine based organic compound slightly soluble in the base oil which prevents separation of the base oil from the composition; said fluorine based organic compound being contained in the composition in an amount of 0.05–14% by weight based on the total amount of the composition, and having one more of perfluoropolyoxyalkyl groups or perfluoropolyoxyalkylene groups in the terminal of the molecule, and being at least one of the compounds represented by the following general formulae:

$$R_f - R_1 - R_2 - Si(OR_3)_3 \qquad (i)$$

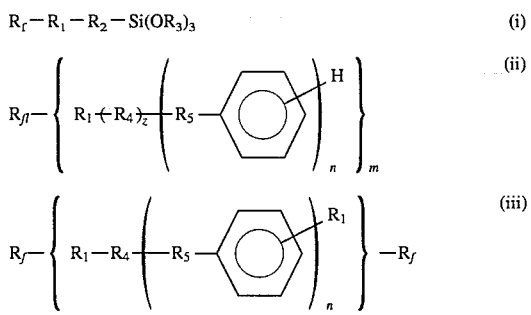

wherein $R_f$ is perfluoropolyoxyalkyl group or perfluoropolyoxyalkylene group; $R_1$ is ester bond, amide bond or methyl ether bond; $R_2$ is $C_2$–$C_5$ alkylene group or amino-substituted alkylene group; $R_3$ is alkyl group having 1–3 carbon atoms; $R_4$ is an oxyalkylene group having 2 or 3 carbon atoms, phenyl group or alkylene group having 1 or 2 carbon atoms; $R_5$ is single bond, ether bond, alkyl group, amide bond or —$C(CH_3)_2$— group, and are the same or different per repeating unit; Z is 0 or a positive integer; n is 0 or a positive integer when $R_4$ is oxyalkylene group, or an integer of 1–5 when $R_4$ is not oxyalkylene group: $R_f$ is perfluoropolyoxyalkyl group when l is 1 or 2 and m is 1, or perfluoropolyoxyalkylene group when l is 1 and m is 2; and l and m cannot be 2 at the same time.

5. The apparatus according to claim 4, wherein said composition contains the heat conducting inorganic powder in an amount that is 5–100% by weight of the weight of the base oil in the composition and 0.05–14% by weight of the fluorine based organic compound based on the total amount of said heat conducting composition.

6. The apparatus according to claim 4, wherein said heat conducting inorganic powder is a material selected from the group consisting of zinc oxide, boron nitride, aluminum nitride and silicon nitride.

7. The apparatus according to claim 4, wherein said fluorine based organic compound is selected from the group consisting of:

$R_f$—CONH—$C_3H_6$—Si(OC$_2$H$_5$)$_3$;

$R_f$—CONH—$C_2H_4$NHC$_3$H$_6$—Si(OCH$_3$)$_2$(CH$_3$); and $R_f$—CONH—$C_2H_4NHC_3H_6$—Si(OCH$_3$)$_3$.

8. An electric appliance comprising a joule heat generating source, means for transferring joule heat outside of the appliance by sliding with said heat generating source, and a semi-solid heat conducting composition positioned between said heat transferring means and said heat generating source, said composition containing a non-fluorine based base oil, a heat conducting inorganic powder having a thermal conductivity or more than 7 W/m-K and a fluorine based organic compound having one or more of perfluoropolyoxyalkyl group or perfluoropolyoxyalkylene groups in the terminal of the molecule, said fluorine based organic compound being contained in the composition in an amount of 0.05–14% by weight based on the total amount of the composition and being at least one of the compounds represented by the following general formulae:

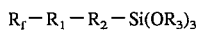 (i)

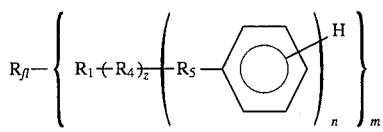 (ii)

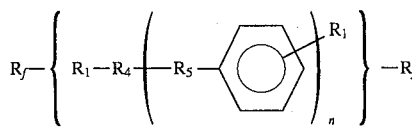 (iii)

wherein $R_f$ is perfluoropolyoxyalkyl group or perfluoropolyoxyalkylene group; $R_1$ is ester bond, amide bond or methyl ether bond; $R_2$ is $C_2$–$C_5$ alkylene group or amino-substituted alkylene group; $R_3$ is alkyl group having 1–3 carbon atoms; $R_4$ is an oxyalkylene group having 2 or 3 carbon atoms, phenyl group or alkylene group having 1 or 2 carbon atoms; $R_5$ is single bond, ether bond, alkyl group, amide bond or —C(CH$_3$)$_2$— group, and are the same or different per repeating unit; Z is 0 or a positive integer; n is 0 or a positive integer when $R_4$ is oxyalkylene group, or an integer of 1–5 when $R_4$ is not oxyalkylene group: $R_f$ is perfluoropolyoxyalkyl group when l is 1 or 2 and m is 1, or perfluoropolyoxyalkylene group when l is 1 and m is 2; and l and m cannot be 2 at the same time.

9. The electric apparatus according to claim 8, wherein said composition contains the heat conducting inorganic powder in an amount that is 5–100% by weight of the weight of the base oil and 0.05–14% by weight of the fluorine based organic compound based on the total weight of the heat conducting composition.

10. The electric appliance according to claim 8, wherein said heat conducting inorganic powder is a material selected from the group consisting of zinc oxide, boron nitride, aluminum nitride and silicon nitride.

11. The electric appliance according to claim 8, wherein said fluorine based organic compound is selected from the group consisting of:

$R_f$—CONH—$C_3H_6$—Si(OC$_2H_5$)$_3$;

$R_f$—CONH—$C_2H_4NHC_3H_6$—Si(OCH$_3$)$_2$(CH$_3$); and $R_f$—CONH—$C_2H_4NHC_3H_6$—Si(OCH$_3$)$_3$.

12. A semi-solid composition comprising a non-fluorine based synthetic oil, a thickener, and a fluorine-based organic compound slightly soluble in said synthetic oil to prevent separation of the oil from the composition; said fluorine based organic compound being contained in the composition in an amount of 0.05–14% by weight based on the total amount of the composition, and having one or more of perfluoropolyoxyalkyl groups or perfluoropolyoxyalkylene groups in the terminal of the molecules, and being at least one of the compounds represented by the following general formulae:

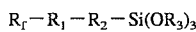 (i)

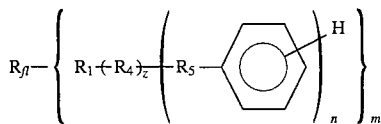 (ii)

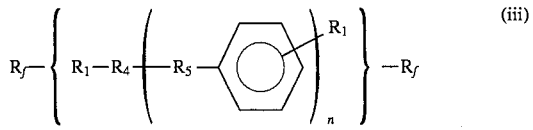 (iii)

wherein $R_f$ is perfluoropolyoxyalkyl group or perfluoropolyoxyalkylene group; $R_1$ is ester bond, amide bond or methyl ether bond; $R_2$ is $C_2$–$C_5$ alkylene group or amino-substituted alkylene group; $R_3$ is alkyl group having 1–3 carbon atoms; $R_4$ is an oxyalkylene group having 2 or 3 carbon atoms, phenyl group or alkylene group having 1 or 2 carbon atoms; $R_5$ is single bond, ether bond, alkyl group, amide bond or —C(CH$_3$)$_2$— group, and are the same or different per repeating unit; Z is 0 or a positive integer; n is 0 or a positive integer when $R_4$ is oxyalkylene group, or an integer of 1–5 when $R_4$ is not oxyalkylene group: $R_f$ is perfluoropolyoxyalkyl group when l is 1 or 2 and m is 1, or perfluoropolyoxyalkylene group when l is 1 and m is 2; and l and m cannot be 2 at the same time.

* * * * *